United States Patent [19]
Westfall

[11] Patent Number: 6,091,787
[45] Date of Patent: Jul. 18, 2000

[54] SYMBOL LOCK DETECTOR

[75] Inventor: Dan L. Westfall, Livermore, Calif.

[73] Assignee: General Dynamics Government Systems Corporation, Needham, Mass.

[21] Appl. No.: 08/997,859

[22] Filed: Dec. 24, 1997

Related U.S. Application Data

[63] Continuation-in-part of application No. 08/772,587, Dec. 24, 1996, abandoned.

[51] Int. Cl.[7] .................................................. H04L 27/06
[52] U.S. Cl. ............................................ 375/340; 375/355
[58] Field of Search ................................... 375/340, 342, 375/355, 371, 224; 329/304, 321; 708/313

[56] References Cited

U.S. PATENT DOCUMENTS

| | | | |
|---|---|---|---|
| 3,940,694 | 2/1976 | Price et al. | 325/42 |
| 4,291,277 | 9/1981 | Davis et al. | 330/149 |
| 4,462,001 | 7/1984 | Girard | 330/149 |
| 4,555,790 | 11/1985 | Betts et al. | 375/39 |
| 4,587,498 | 5/1986 | Bonnerot et al. | 329/122 |
| 4,615,038 | 9/1986 | Lim et al. | 375/14 |
| 4,731,816 | 3/1988 | Hughes-Hartogs | 379/98 |
| 4,805,191 | 2/1989 | Burch et al. | 375/11 |
| 4,827,431 | 5/1989 | Goldshtein | 364/514 |
| 4,890,300 | 12/1989 | Andrews | 375/60 |
| 4,980,897 | 12/1990 | Decker et al. | 375/38 |
| 4,995,057 | 2/1991 | Chung | 375/13 |
| 5,105,445 | 4/1992 | Karam et al. | 375/60 |
| 5,107,520 | 4/1992 | Karam et al. | 375/60 |
| 5,113,414 | 5/1992 | Karam et al. | 375/60 |
| 5,148,448 | 9/1992 | Karam et al. | 375/60 |
| 5,249,200 | 11/1993 | Chen et al. | 375/58 |
| 5,285,474 | 2/1994 | Chow et al. | . |
| 5,295,138 | 3/1994 | Greenberg et al. | 370/57 |
| 5,313,467 | 5/1994 | Varghese et al. | 375/260 |
| 5,339,054 | 8/1994 | Taguchi | 332/100 |
| 5,394,392 | 2/1995 | Scott | 370/24 |
| 5,479,447 | 12/1995 | Chow et al. | 375/260 |
| 5,497,505 | 3/1996 | Koohgoli et al. | 455/34.1 |
| 5,519,356 | 5/1996 | Greeberg | 329/340 |
| 5,548,809 | 8/1996 | Lemson | 455/34.1 |
| 5,572,553 | 11/1996 | Kimiavi et al. | 375/344 |
| 5,606,577 | 2/1997 | Grube et al. | 375/295 |
| 5,621,767 | 4/1997 | Brandt et al. | 375/344 |
| 5,673,290 | 9/1997 | Cioffi | 375/260 |
| 5,694,440 | 12/1997 | Kallman et al. | 375/355 |
| 5,705,958 | 11/1998 | Janer | 332/103 |
| 5,710,766 | 1/1998 | Schwendeman | 370/329 |
| 5,726,978 | 3/1998 | Frodigh et al. | 370/252 |
| 5,732,333 | 3/1998 | Cox et al. | 455/126 |
| 5,751,766 | 5/1998 | Kletsky et al. | 375/224 |

OTHER PUBLICATIONS

Suzuki, T., takatori, H., Ogawa, M. and Tomooka, K., "Line Equalizer for a Digital Subscriber Loop Employing Switched Capacitor Technology," IEEE Trans. on Communications, vol. COM–30, No. 9, pp. 2074–2082, Sep. 1982.

Agazzi, O., Tzeng, C.–P.J., Messerchmitt, D.G., and Hodges, D.A., "Timing Recovery in Digital Subscriber Loops," IEEE Trans. on Communications, vol. COM–33, No. 6, pp. 558–569, Jun.1985.

Gardner, F.M., "A BPSK/ZPSK Timing—Error Detector for Sampled Receivers," IEEE Trans. on Communications, vol. COM–34, No. 5, pp. 423–429, May 1986.

Meyers, M.H., "Robust Control of Decision Directed Loops," IEEE CH2655–9/89/0000–1030, pp. 1030–1036, Sep. 1989.

(List continued on next page.)

*Primary Examiner*—Don N. Vo
*Attorney, Agent, or Firm*—Jenner & Block

[57] ABSTRACT

A simplified symbol lock detector which uses T/2 spaced signal samples in conjunction with an interpolator to approximate the T/4 shifted signal samples used by conventional symbol lock detectors. The approximated T/4 shifted signal samples are processed by a phase detector prior to input to a threshold detector which indicates proper symbol lock if the lock signal exceeds a predetermined threshold.

10 Claims, 3 Drawing Sheets

OTHER PUBLICATIONS

Sari, Hikmet, and Said, Moridi, "New Phase and Frequency Detectors for Carrier Recovery in PSK and QAM Systems", IEEE Trans. on Communications, vol. 36, No. 9, pp. 1035–1043, Sep. 1988.

Sari, H., Desperben, L., and Moridi, S., "A New Class of Frequency Detectors for Carrier Recovery in QAM Systems", IEEE CH2314–3/86/0000–0482, pp. 482–486, 1986.

Brown, R., Sorbaba, M., Wang, T., Segev, R., Van Kerkhove, J.F., Mildonian, H., Hall, C., Zimmerman, G., Martinez, K., Pires, T.K., Mullaney, K., Zain, I., Young, B., Gleichauf, P., Hohhof, K., "Draft Interface Specification for a CAP Based RADSL System", Jul, 22, 1996.

Karam, G., and Sari, H., "A Data Predistortion Technique with Memory for QAM Radio Systems", IEEE Trans. on Communications, vol. 39, No. 2, pp. 336–344, Feb. 1991.

6,091,787

SYMBOL LOCK DETECTOR

This is a continuation-in-part of application Ser. No. 08/772,587 filed on Dec. 24, 1996 now abandoned.

FIELD OF THE INVENTION

The present invention generally relates to the field of data communications. More specifically, the present invention relates to a symbol lock detector for determining the proper timing and sampling of a received signal.

BACKGROUND OF THE INVENTION

Digital data communication systems oftentimes transmit information in the form of pulses. A stream of information (or digital bits) is conveyed as a stream of pulses. In one simple embodiment, a digital "1" is transmitted as a positive pulse, while a digital "0" is transmitted as a negative pulse. Each pulse lasts for a duration of time inversely proportional to the bit rate of the system. Thus, for a simple binary system (i.e., one bit per baud) transmitting 1 Mb/s, then the time duration for each bit is 1 microsecond. The incoming signal is sampled once per baud to determine the digital bit to be assigned to that baud. As the baud rate of the system increases, the baud interval decreases and it becomes necessary to insure that the received signal is being sampled at the proper point in time within each baud. The baud interval is often denoted T, and the baud rate denoted 1/T.

One critical component of a data communications system is a symbol lock detector, which is used to determine when the proper sampling point for each baud has been achieved. Another critical component in a communications system is a phase detector, which is used in a phase locked loop (PLL) to achieve the zero phase point of the received signal.

That is, for a pulse signal representation, the points where the signal waveform crosses the horizontal axis (i.e., zero phase) are determined.

In a phase detector for a T/2 (two times oversampling) system, the received signal is sampled at a reference location (and T/2 (half the baud interval) later, i.e., the "T/2" location. One of the sample points is used to determine the actual data value, while both samples are used to determine the correct phase of the received signal.

Conventional two times oversampling symbol lock detectors need to sample an incoming signal at the T/4 (one-quarter baud interval after the reference location) and 3T/4 (three-quarters of the baud interval after the reference location) marks for proper operation. However, the T/4 and 3T/4 sample points are generally not available and must be especially determined in addition to the reference and T/2 sample points. The requirement of having to sample the received signal an additional two times (T/4 and 3T/4) adds to the cost and complexity of the receiver circuit.

SUMMARY OF THE INVENTION

The present invention is for a symbol lock detector circuit which obviates the need for having to sample the incoming signal at the T/4 and 3T/4 locations in order to determine proper symbol lock. In the present invention, the reference location signal and T/2 signal samples are interpolated to provide an approximation of the T/4 and 3T/4 sample points used in the symbol lock detector circuit.

The present invention will become more apparent from the following Brief Description of the Drawings and Description of Preferred Embodiments.

DESCRIPTION OF PREFERRED EMBODIMENTS

Figure 1:
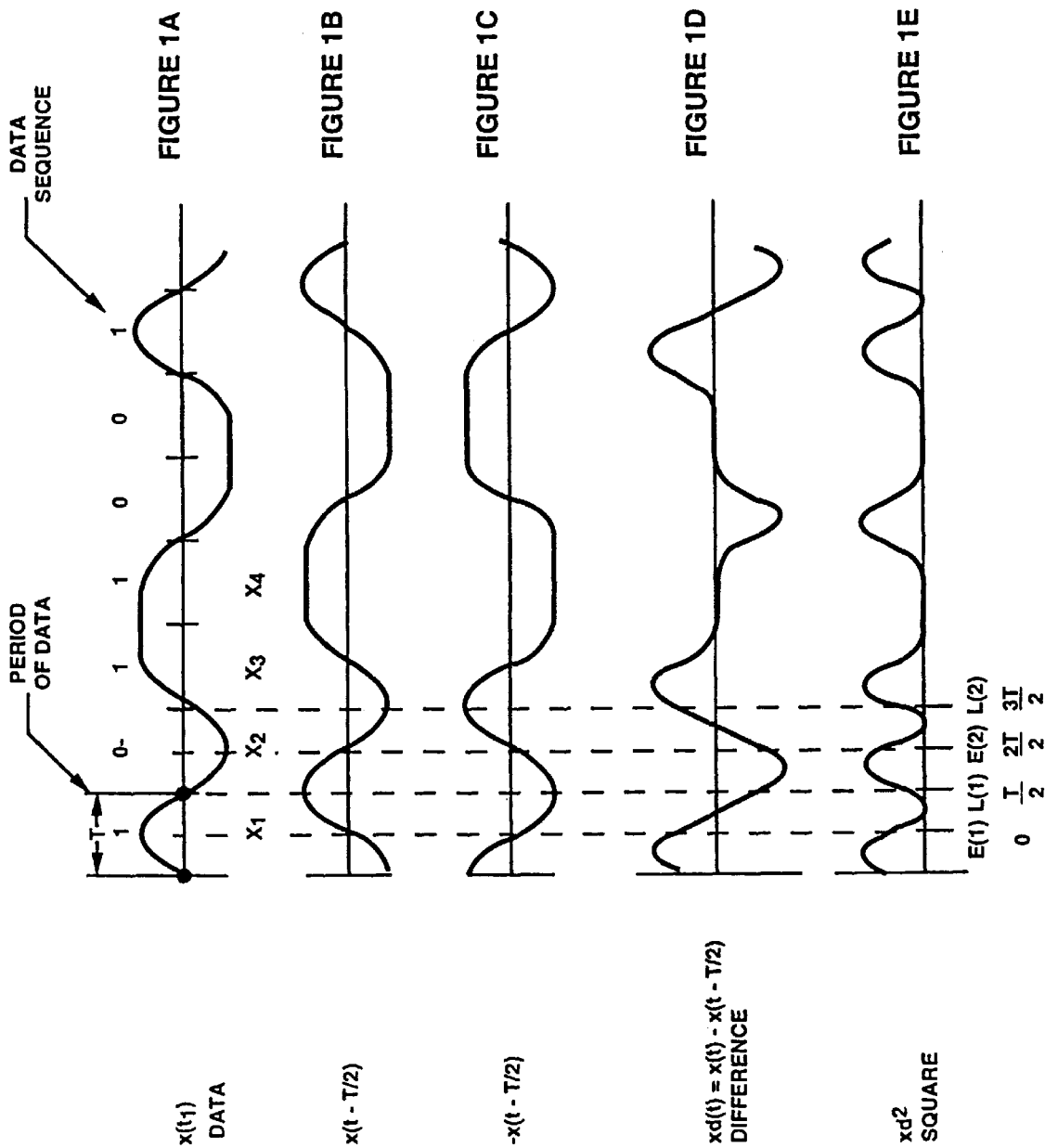
FIGS. 1A through 1E are illustrations of signal waveforms used by the symbol lock detector circuit.

Referring to FIG. 1A, therein is shown a signal waveform x(t) for a signal. The signal is essentially a pulse signal whose amplitude ranges between +1 (positive phase) and −1 (negative phase). The +1 value is used to indicate a binary 1, while the −1 value is used to indicate a binary 0. The symbol period T (baud interval) of signal x(t) is defined as the period of a single pulse. At the receiver, the signal x(t) is sampled twice per symbol period. The first sample is at location x(t) (e.g., x1, x2, x3, ...) and is used to determine the data content of the particular symbol. This first sample is often referred to as the early sample. The second sample is at the T/2 point, i.e., halfway in between the x sample points and is used for phase detection and locking purposes. This second sample is often referred to as the late sample. In the specific waveform of FIG. 1A, the reference location sample is located at the middle of the baud interval (i.e., at t=T/2), while the "T/2" signal sample is located at the end of the baud interval (i.e., at t=T), for the first baud interval illustrated.

FIGS. 1B and 1C illustrate the waveforms x(t−T/2) and its inverse, i.e., −x(t−T/2), which are used to provide the difference signal xd(t)=x(t)−x(t−T/2), which is shown in FIG. 1D. Next, the difference signal xd(t) is squared, resulting in the squared signal $xd^2$, which is shown in FIG. 1E. The squared signal $xd^2$ is used by the symbol lock detector, as will be described in detail below.

Figure 2:
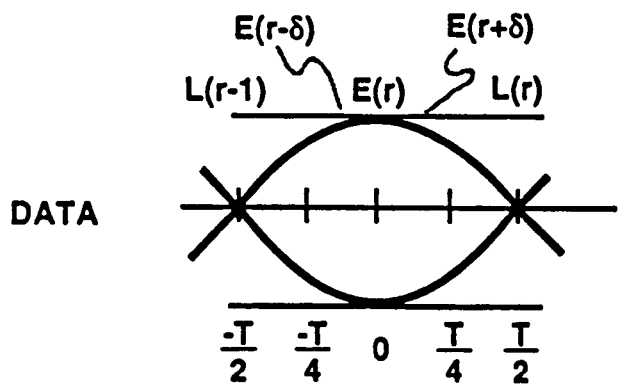
FIG. 2 is an illustration of a data signal showing the open eye and closed eye positions.

Referring now to FIG. 2, therein is shown a portion of the data signal x(t) to illustrate the open and closed eye positions of the data signal. The waveform in FIG. 2 is actually a superimposition of several waveforms, with one being a digital 1 signal (the upper pulse) and the other being a digital 0 signal (the lower pulse). The open eye position of the signal waveform is located at the "0" or reference position. Similarly, the closed eye position is located at both the T/2 and −T/2 positions.

Figure 3:
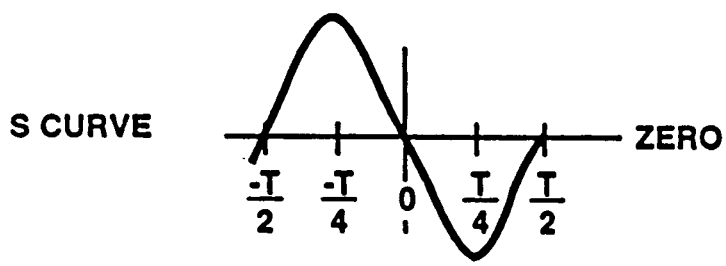
FIG. 3 is an illustration of an S-curve used by the symbol lock detector circuit.

The S-curve produced by the phase detector is illustrated in FIG. 3, and is obtained by differentially sampling the $xd^2$ signal (FIG. 1E) according to the following relationship: U(r)=E(r)−L(r−1). U(r) is the signal illustrated in the S-curve of FIG. 3. The E and L sampling points are shown on the $xd^2$ waveform of FIG. 1E. E corresponds to the data sample at the open eye position, while L corresponds to the data sample at the closed eye position in the previous period.

The S-curve signal U(r) is zero when the $xd^2$ signal is properly sampled at the center of the data waveform because it is at that point that E(r) and L(r−1) are equal. If instead the sampling point is early by an amount delta, i.e., the sampling point is shifted to the left, then E(r−delta) becomes larger and L(r−1−delta) becomes smaller, resulting in U(r) increasing in value. Conversely, if the sampling point is delayed by an amount delta, i.e., the sampling point is shifted to the right, then E(r+delta) becomes smaller and L(r−1+delta) becomes larger, resulting in U(r) decreasing in value.

In this manner, U(r) is used to determine whether proper phase has been achieved. Ideally, U(r)=0 indicates proper phase, whereas $U(r)>0$ indicates that the sampling point is too early, and $U(r)<0$ indicates the sampling point is too late. As shown in the S-curve of FIG. 3, for each symbol period there are actually three points at which $U(r)=0$, i.e., at $t=0$, $t=-T/2$ and $t=T/2$. However it is only the $t=0$ point which is the proper sampling point. The symbol lock detector circuit discriminates between the three possible $U(r)=0$ points by analyzing the slope of the $U(r)$ curve. As is evident from FIG. 3, the slope of the $U(r)$ curve is negative at $t=0$, while the slope is positive at both $t=T/2$ and $t=-T/2$. Thus, the particular $U(r)=0$ point at which the slope of $U(r)$ is also negative is selected as the proper sampling point.

Figure 4:
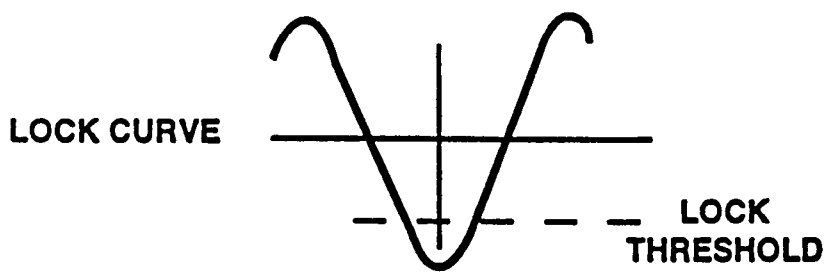
FIG. 4 is an illustration of a lock curve used by the symbol lock detector circuit.

Since an analysis of the slope of $U(r)$ is somewhat complicated, the selection of the particular $U(r)=0$ point is not carried out by analyzing the slope, but is instead carried out by using a threshold detector to analyze the magnitude of a shifted version of the $U(r)$ signal. This process is described with reference to FIG. 4. The lock curve illustrated in FIG. 4 is essentially the S-curve of FIG. 3 shifted by $T/4$ to the left. A threshold detection is performed at the reference location on the lock curve of FIG. 4 in order to determine if the magnitude of the lock curve exceeds a predetermined threshold at that point. If the predetermined threshold is exceeded, then the lock curve which has been obtained correctly indicates the proper sampling of the data signal.

The lock curve of FIG. 4 is typically obtained by sampling the xd**2 signal at the $T/4$ and $3T/4$ positions (this corresponds to a $T/4$ shift from the normal reference and $T/2$ sample points). In conventional symbol lock detectors, this requires that the incoming data signal be sampled four times per symbol period, i.e., the normal samples at the reference and $T/2$ positions, as well as the additional samples at $T/4$ and $3T/4$ positions. As indicated above, this increases the cost and complexity of the symbol lock detector circuit.

According to the present invention, the need for the $T/4$ and $3T/4$ samples is eliminated. Instead, the $T/4$ and $3T/4$ samples are approximated using a straight line interpolation such that $x(t-T/4)=1/2(x(t)+x(t-T/2))$. Additionally, it will be recalled that the expression for the S-curve is $U(r)=E(r)-L(r-1)$, and the lock curve, which is actually shifted by $T/4$, is expressed as $U(r-1/4)=E(r-1/4)-L(r-5/4)$. This latter expression for $U(r-1/4)$ may be simplified and expressed as a function of the data signal x as $U(r-1/4)=x(r-3/4)*(x(r-1/4)-x(r-5/4))$. The exact details of simplifying the expression for $U(r-1/4)$ may be found in Floyd M. Gardner, "A BPSK/QPSK Timing-Error Detector for Sampled Receivers", IEEE Transactions on Communications, Vol. Com-34, No. 5, May 1986, the contents of which are incorporated herein by reference.

Figure 5:
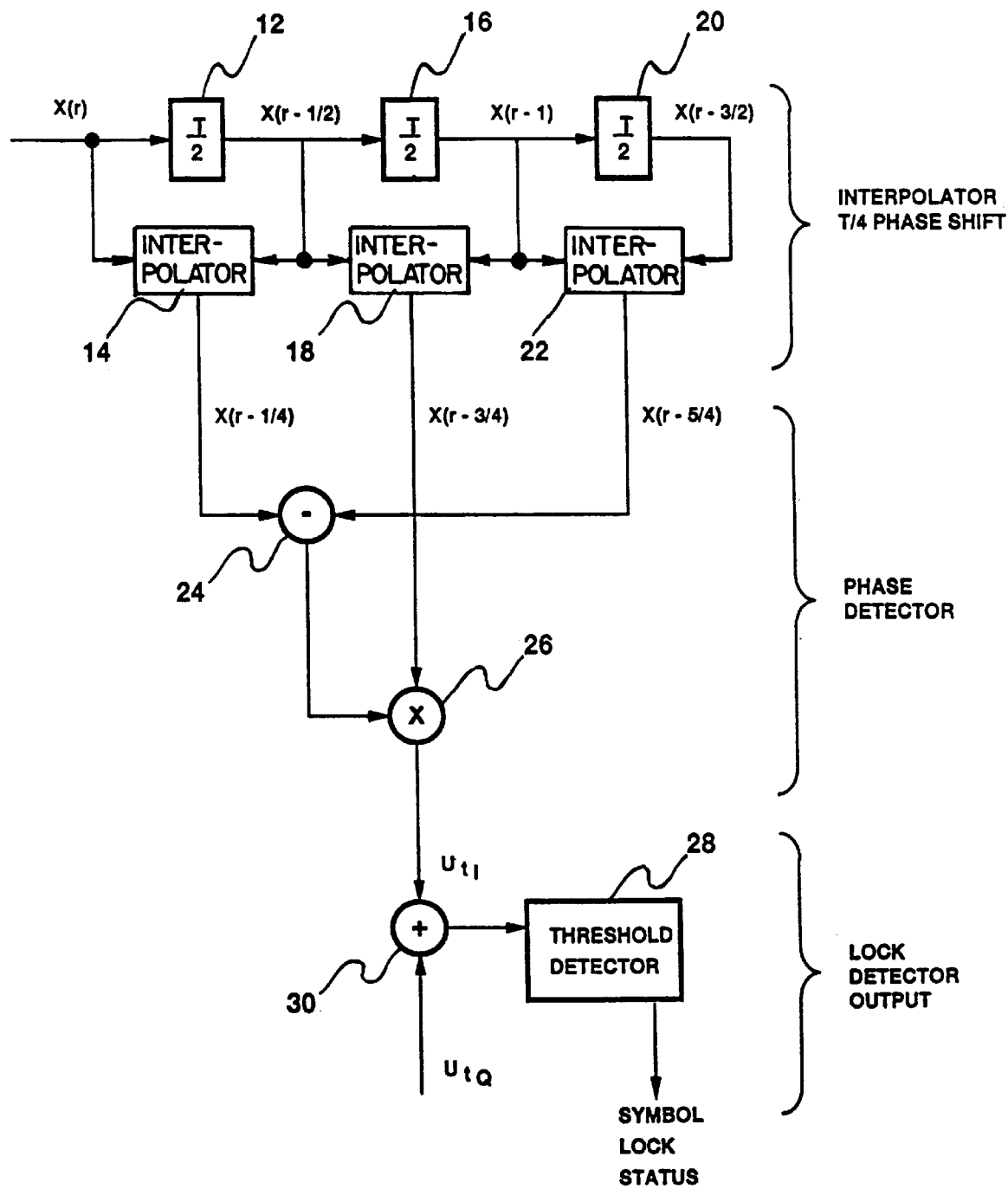
FIG. 5 is a block diagram of the symbol lock detector circuit.

According to the present invention, the values of x at $T/4$, $3T/4$ and $5T/4$ are obtained by interpolating the values of x at 0 (reference location), $T/2$, $T$ and $3T/2$. Referring now to FIG. 5, therein is shown a block diagram of the interpolating symbol lock detector according to the present invention. The signal $x(r)$ is input to a $T/2$ delay block, as well as an interpolator 14. Interpolator 14 receives as inputs the signal $x(r)$ and the delayed signal $x(r-1/2)$, and outputs the averaged signal $x(r-1/4)$. The signal $x(r-1/2)$ is input to $T/2$ delay block 16, as well as interpolator 18. Interpolator 18 receives as inputs the signals $x(r-1/2)$ and $x(r-1)$, and outputs the averaged signal $x(r-3/4)$. Continuing, the signal $x(r-1)$ is input to $T/2$ delay block 20, as well as interpolator 22. Interpolator 22 receives as inputs the signals $x(r-1)$ and $x(r-3/2)$, and outputs the averaged signal $x(r-5/4)$.

The signals $x(r-5/4)$ is subtracted from $x(r-1/4)$ in subtractor 24. The difference $x(r-1/4)-x(r-5/4)$ is then multiplied by the signal $x(r-3/4)$ in multiplier 26. The output of multiplier 26 is the lock curve signal, which is then passed onto threshold detector 28, whose output is the symbol lock status indicator.

FIG. 5 includes an adder 30 placed in between multiplier 26 and threshold detector 28. One of the inputs to adder 30 is the output of multiplier 26. The other input to adder 30 is set to zero in the case of BPSK signals, and thus, the adder 30 has no practical effect. Adder 30 is primarily used in the case of QPSK signals, where the circuitry of FIG. 5 is used to process the I portion of the QPSK signal, and the circuitry is duplicated for processing the Q portion of the QPSK signal. The output of multiplier 26 ($u_{rI}$) and the output ($u_{rQ}$) of the corresponding multiplier for the Q signal (not shown) are then added by adder 30 before being passed on to threshold detector 28.

While the invention has been particularly shown and described with reference to a preferred embodiment thereof, it will be understood by those skilled in the art that various changes in form and details may be made therein without departing from the spirit and scope of the invention.

What is claimed is:

1. A symbol lock detector used to indicate the proper sampling point for each baud of a signal, said symbol lock detector using $T/2$ spaced samples of a signal, and comprising:

an interpolator which receives as input the $T/2$ spaced signal samples and outputs an approximation of $T/4$ shifted signal samples;

a phase detector circuit which receives as input the approximated $T/4$ shifted samples and outputs a lock signal; and a threshold detector which compares said lock signal to a predetermined threshold and outputs a symbol lock signal indicating whether said lock signal exceeds said predetermined threshold.

2. The symbol lock detector of claim 1, further comprising a signal sample adjustor which adjusts the time of said signal sample in accordance with said symbol lock signal.

3. The symbol lock detector of claim 1 wherein said interpolator is a straight line interpolator.

4. A symbol lock detector used to indicate the proper sampling point for each baud of a signal, said symbol lock detector using $T/2$ spaced samples of a signal, and comprising:

an interpolator which receives as input the $T/2$ spaced signal samples and outputs an approximation of $T/4$ shifted signal samples;

a phase detector circuit which receives as input the approximated $T/4$ shifted samples and outputs a lock signal; and a slope indicator which indicates the slope of said lock signal to thereby determine whether said signal is properly locked and being sampled at the proper sampling point.

5. The symbol lock detector of claim 4, further comprising a signal sample adjustor which adjusts the time of said signal sample in accordance with the slope of said lock signal.

6. A method for performing symbol lock detection using 0, $T/2$, $T$ and $3T/2$ samples of a signal, said method comprising the following steps:

interpolating the 0 and $T/2$ signal samples to produce an approximation of a $T/4$ signal sample;

interpolating the $T/2$ and $T$ signal samples to produce an approximation of a $3T/4$ signal sample;

interpolating the T and 3T/2 signal samples to produce an approximation of a 5T/4 signal sample;

subtracting the approximated T/4 and 5T/4 signal samples to produce a difference signal;

multiplying the difference signal by the approximated 3T/4 signal sample to produce a lock signal;

comparing said lock signal to a predetermined threshold, and outputting a symbol lock signal indicating whether said difference signal exceeds said predetermined threshold.

7. The method of claim 6, further comprising the step of adjusting the time of said signal sample in accordance with said symbol lock signal.

8. A method for performing symbol lock detection using 0, T/2, T and 3T/2 samples of a signal, said method comprising the following steps:

interpolating the 0 and T/2 signal samples to produce an approximation of a T/4 signal sample;

interpolating the T/2 and T signal samples to produce an approximation of a 3T/4 signal sample;

interpolating the T and 3T/2 signal samples to produce an approximation of a 5T/4 signal sample;

subtracting the approximated T/4 and 5T/4 signal samples to produce a difference signal;

multiplying the difference signal by the approximated 3T/4 signal sample to produce a lock signal;

indicating the slope of said lock signal to thereby determine whether said signal is properly locked and being sampled at the proper sampling point.

9. The method of claim 8, further comprising the step of adjusting the time of said signal sample in accordance with said lock signal slope.

10. A method for performing symbol lock detection using 0, T/2, T, 3T/2 and 2T samples of a signal, said method comprising the following steps:

interpolating the 0 and T/2 signal samples to produce an approximation of a T/4 signal sample;

interpolating the T/2 and T signal samples to produce an approximation of a 3T/4 signal sample;

interpolating the T and 3T/2 signal samples to produce an approximation of a 5T/4 signal sample;

interpolating the 3T/2 and 2T signal samples to produce an approximation of a 7T/4 signal sample, subtracting the approximated 3T/4 signal sample from the approximated T/4 signal sample and squaring the difference to produce a first difference signal;

subtracting the approximated 7T/4 signal sample from the approximated 5T/4 signal sample and squaring the difference to produce a second difference signal;

subtracting said second difference signal from said first difference signal to produce a lock signal; and comparing said lock signal to a predetermined threshold, and providing an indication of symbol lock if said lock signal exceeds said predetermined threshold.

* * * * *